United States Patent [19]

Boudry et al.

[11] Patent Number: 5,652,538
[45] Date of Patent: Jul. 29, 1997

[54] INTEGRATED CIRCUIT WITH CONDUCTANCE ADJUSTABLE BY DIGITAL CONTROL SIGNAL

[75] Inventors: Jean-Marie Boudry, Montigny le Bretonneux, France; Sleiman Chamoun, Phoenix, Ariz.

[73] Assignee: Bull S.A., Louveciennes, France

[21] Appl. No.: 597,802

[22] Filed: Feb. 7, 1996

[30] Foreign Application Priority Data

Feb. 8, 1995 [FR] France ................... 95 01458

[51] Int. Cl.$^6$ ................... H03K 17/62; H03K 17/687
[52] U.S. Cl. ................... 327/403; 327/334; 327/427
[58] Field of Search ................... 327/403–405, 327/427, 434, 435, 436, 104, 184, 77, 581, 479, 482, 334

[56] References Cited

U.S. PATENT DOCUMENTS

| 4,667,337 | 5/1987 | Fletcher | 327/403 |
| 4,707,620 | 11/1987 | Sullivan | 326/86 |
| 5,039,879 | 8/1991 | Parrish | 327/334 |
| 5,552,744 | 9/1996 | Burlison et al. | 327/403 |
| 5,589,789 | 12/1996 | Kamiya | 327/404 |

FOREIGN PATENT DOCUMENTS

| 408841 | 1/1991 | European Pat. Off. . |
| 511536 | 11/1992 | European Pat. Off. . |

*Primary Examiner*—Toan Tran
*Attorney, Agent, or Firm*—Kerkam, Stowell, Kondracki & Clarke, P.C.; Edward J. Kondracki

[57] ABSTRACT

The integrated circuit includes at least one conductance (6) which is adjustable by a digital control signal (17) which encodes steps in value for quantizing an exact value to within a fixed relative accuracy Δp. The conductance (6) includes elementary conductances which each define a step in value such that each elementary conductance is dimensioned so that a single level in value of the conductance (6) corresponds to two successive levels of the value of the digital control signal (17). If the result from the first of the two levels of value of the digital control signal (17) is a value which is lower, or respectively higher, than the exact value, the corresponding elementary conductance is enabled, or respectively disabled. Accordingly, the adjusted total value of the conductance (6) is equal to the exact value to within the same relative accuracy Δp, without oscillating between two values straddling this exact value. It is possible to use this type of conductance in high frequency communication integrated circuits.

7 Claims, 5 Drawing Sheets

INTEGRATED CIRCUIT WITH CONDUCTANCE ADJUSTABLE BY DIGITAL CONTROL SIGNAL

BACKGROUND OF THE INVENTION

1. Field of the Invention

This invention relates to the field of integrated circuits comprising one or more conductances which are adjusted to a controlled value. Such circuits are useful in many applications, such as input-output couplers for high rate data buses, for example. Such buses are formed of high frequency lines which require matching impedances whose conductances are adjusted to very precise values. The integration of the conductances into the user integrated circuit offers a considerable space saving and reduces the problems of connecting the circuit to a calibrated component external to the integrated circuit.

2. Description of the Related Art

In order to avoid sensitivity of the adjustment of the conductance to electrical noise and to operational drift, it is preferable to drive this adjustment by means of a digital signal. A digital control signal is produced in such a way as to approximate the exact value desired using discrete values. The exact desired value is then included in an interval defined by two successive discrete values of the digital control signal. The size of this interval introduces an error in the control value relative to the exact desired value. The digital signal is constantly compared with the exact desired value, and therefore has a tendency to oscillate between the two discrete values which straddle the exact value. Now, oscillations of the adjusted value of the integrated conductance are unacceptable, since they keep modifying the current passing through them and accordingly interfere with its usage at high frequency.

One known solution consists in reducing the sensitivity of the comparison of the digital signal with the exact desired value by means of a dead band in which no account is taken of the comparison error to modify the digital signal. This dead band introduces a constant absolute error into the digital signal approximation of the exact desired value. Too small a width of the dead band relative to the size of the quantization intervals of the digital value makes the dead band inoperative for filtering out the oscillations. A width of the dead band greater than the quantization interval introduces an error greater than that of the interval alone. Now, in order to adjust the conductance with a constant relative accuracy, it is desirable to define the quantization interval as a constant proportion of the value of its lower limit. This results in small intervals for the low desired values and large intervals for the high desired values. A dead band width of the same order of magnitude as the smallest interval is inoperative for the high values to be adjusted and a dead band width of the same order of magnitude as the biggest interval introduces an error for the low values to be adjusted which is greater than the relative error obtained with the small intervals. A dead band which reduces the sensitivity of the comparison of the digital signal with the exact desired value therefore encounters difficulties for adjusting a digital signal with a constant relative accuracy.

OBJECTS OF THE INVENTION

The object of the invention is an integrated circuit comprising at least one conductance which is adjustable by means of a digital control signal quantizing an exact value with a given relative accuracy $\Delta p$, such that the adjusted value of this conductance will be equal to the exact value within the same relative accuracy $\Delta p$, without oscillating between two values straddling the said exact value.

DESCRIPTION OF THE INVENTION

To this end, a conductance of the integrated circuit in accordance with the invention comprises elementary conductances which each define a step in value, such that each elementary conductance is dimensioned so that a single level of the value of the conductance corresponds to two successive levels of the value of the digital control signal, and such that, if a value results from the first of the two levels of value of the digital control signal which is lower, or respectively higher, than the exact value, the corresponding elementary conductance is enabled, or respectively disabled.

It is possible to generate a digital drive signal which has the properties mentioned above and which is transmitted to an integrated circuit in accordance with the invention. The generation of the drive signal from the control signal in the integrated circuit gives the integrated circuit greater autonomy.

To this end, the integrated circuit comprises a logic unit which samples the control signal with a frequency given by a clock signal, generating a digital drive signal of which q bits at 1 enable q elementary conductances of the adjustable conductance, the qth bit of the drive signal being set to 1, or respectively to 0, by two successive samplings at 1, or respectively at 0, of the (2q−2)th bit of the control signal.

An additional advantage is obtained if the control signal takes account of the physical behaviour of the integrated circuit that uses it by means of a detector disposed in the circuit.

To this end, the integrated circuit comprises a second conductance, comprising elementary conductances which each define a step in value, such that each elementary conductance is dimensioned so that one level of the value of the conductance corresponds to one level of the value of the digital control signal, and such that each bit of the control signal which is at 1, or respectively each bit of the control signal which is at 0, enables, or respectively disables, one elementary conductance of the conductance.

It is possible to generate a digital control signal which has the properties mentioned above and which is transmitted to an integrated circuit in accordance with the invention. The generation of the control signal from the exact desired value in the integrated circuit gives an additional advantage to the circuit in that the circuit is intrinsically self adaptive to its environment.

To this end, the integrated circuit comprises a comparator which generates a binary signal of which a first state, or respectively a second state, corresponds to a value of the second conductance which is lower, or respectively higher, than the exact value of a conductance standard, which is external to the integrated circuit.

DESCRIPTION OF THE DRAWINGS

The embodiment of the invention as well as other features and advantages thereof will appear from the following description given with reference to the drawings.

DESCRIPTION OF THE PREFERRED EMBODIMENTS

Figure 1:
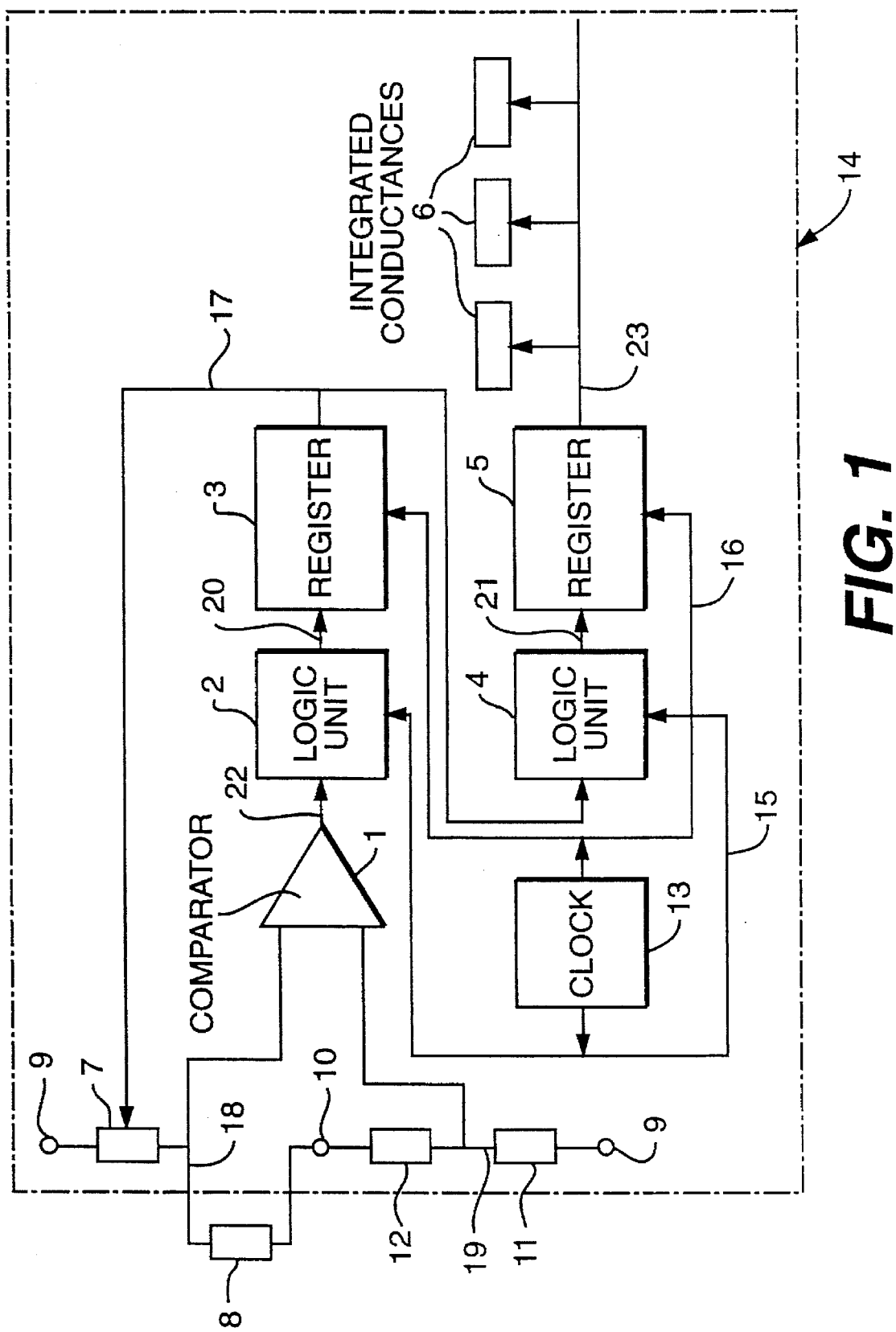
FIG. 1 shows a drive circuit adapted to the invention.

FIG. 1 is a block schematic diagram of an electrical circuit integrated in a component 14, connected to a conductance standard 8, external to the component 14. The conductance standard 8 is connected in series with a variable integrated conductance 7, between a node 9 at a potential Vh and a node 10 at a potential Vss. Two integrated conductances 11 and 12 are connected in series between the nodes 9 and 10. The values of the conductances 11 and 12 are identical. The common point 18 of the conductances 7 and 8 is connected to a first input of a comparator 1. The common point 19 of the conductances 11 and 12 is connected to a second input of the comparator 1. The comparator 1 is formed, for example, using a high gain differential amplifier which constitutes a bistable circuit. The comparator 1 generates a binary signal 22 having a first state which corresponds to the differential amplifier switching to low saturation and having a second state which corresponds to the differential amplifier switching to high saturation. The signal 22 is inputted to a logic unit 2 which generates a digital signal 20. The signal 20 consists of 2n binary signals, or bits, stored in a register 3. The numerical value of the signal 20 is directly equal to the number of bits which are at 1. A clock generator 13 generates a first clock signal 15, as well as a second clock signal 16 of the same frequency and shifted in phase relative to the first clock signal. Initially, only the first bit of the signal 20 is at 1, and this corresponds to a residual value below which it cannot be reduced, the other 2n−1 bits of the signal 20 being at 0. At each pulse of the signal 15, in the first state of the signal 22, the logic unit 2 increments the signal 20 by one unit, by switching one additional bit of this signal from 0 to 1, as long as there is still a bit at 0. At each pulse of the signal 15, in the second state of the signal 22, the logic unit 2 decreases the value of the signal 20 by one unit, by switching one bit of this signal from 1 to 0, as long as there is still a bit at 1 other than the first bit. At each pulse of the signal 16, the register 3 stores the signal 20 in the form of a signal 17 of 2n bits equal to the 2n bits of the signal 20.

Figure 2:
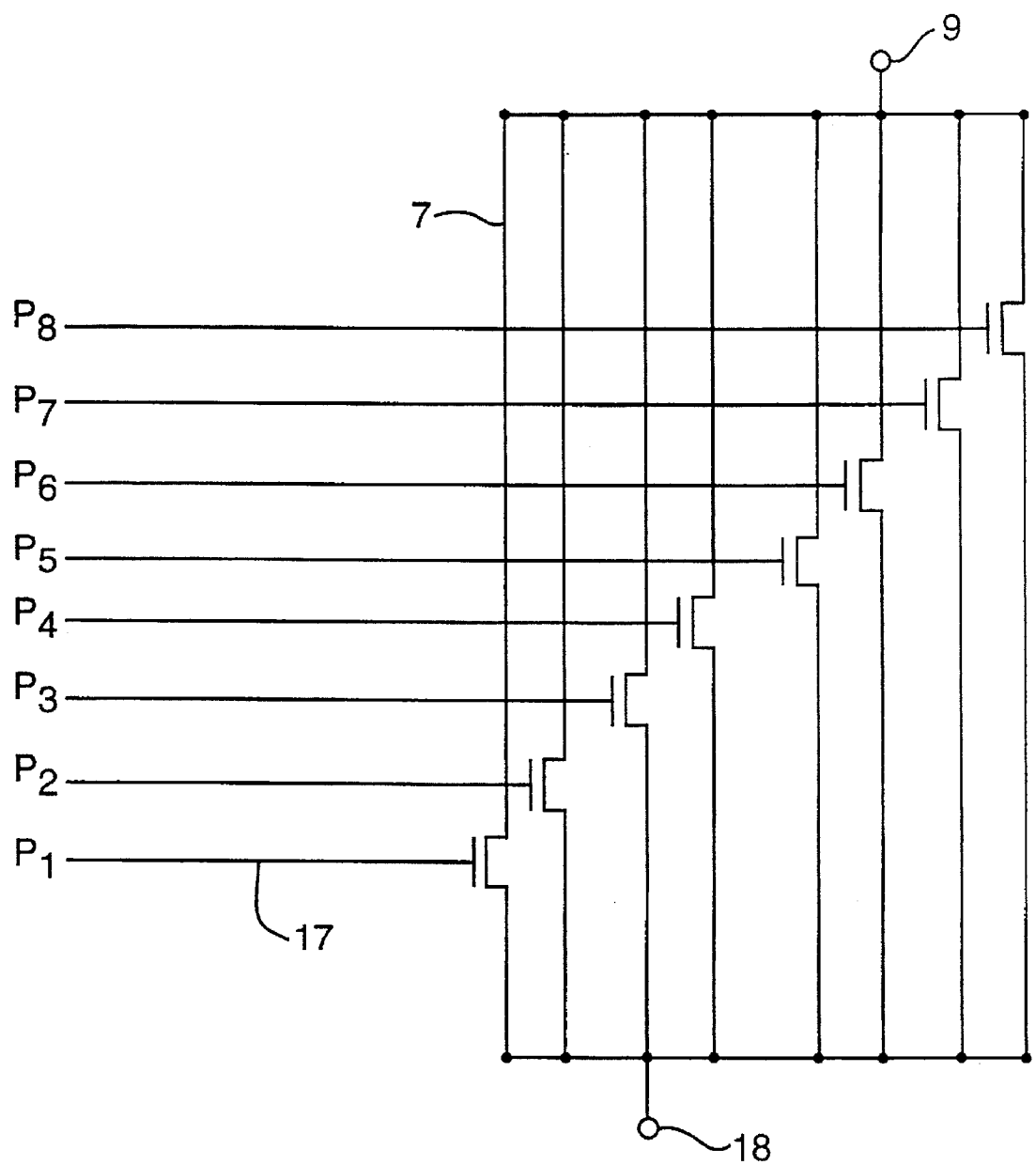
FIG. 2 shows an adjustable integrated conductance.

FIG. 2 shows an example of an embodiment of a variable integrated conductance 7. The conductance 7 consists of 2n MOS transistors. In this example, n is equal to four but the explanations remain valid for any other number n. The conductance of each MOS transistor is proportional to the width W and inversely proportional to the length l of its drain-source channel. The drains of all the transistors are connected to the node 9 and the sources of all the transistors are connected to the node 18. The gate of each transistor is controlled by a different bit of the signal 17. Thus the first p bits of the signal 17 which are at 1 switch on the first p transistors of the network constituting the conductance 7, whereas the other 2n−p bits of the signal 17 at 0 switch off the other 2n−p transistors. In this way, the p transistors which are on define the value of the conductance 7. The switching of a bit of the signal 17 from 0 to 1 therefore increases the value of the conductance 7 by a value defined by the width W and the length l of the transistor which is switched on by this bit. The first transistor of the network is dimensioned so that it has a conductance of the same order of magnitude as the conductance 8, but substantially less in value. It forms a residual conductance below which the conductance 7 cannot be reduced. The other transistors of the network are dimensioned in such a way that the conductance of each one forms an increment of conductance, and that the cumulated conductance of all the transistors in the network is substantially greater than the value of the conductance 8. The increments are of increasing value, so that the ratio of each one to the sum of the preceding conductances is substantially constant. This enables a constant relative accuracy $\Delta p$ to be obtained.

In the schematic diagram of FIG. 1, the conductances 11 and 12 being equal, the potential of their common point 19 is equal to the potential of the common point 18 of the conductances 7 and 8 when their values are equal. When the value of the conductance 7 is lower than that of the conductance 8, the potential of the common point 18 switches the amplifier of the comparator 1 to low saturation, generating the first state of the signal 22. At each pulse of the signal 15, then at each pulse of the signal 16, an additional bit of the signal 17 switches from 0 to 1. As we saw above, the effect of this is to increase the value of the conductance 7. When the value of the conductance 7 is higher than that of the conductance 8, the potential of the common point 18 switches the amplifier of the comparator 1 to high saturation, generating the second state of the signal 22. At each pulse of the signal 15, then at each pulse of the signal 16, an additional bit of the signal 17 switches from 1 to 0. As we have seen above, the effect of this is to reduce the value of the conductance 7. The value of the conductance 7 finishes up by oscillating between a first discrete value just below that of the conductance 8 and a second discrete value just above that of the conductance 8. In the network of the FIG. 2, the first value corresponds to p transistors switched on and the second value corresponds to p+1 transistors switched on. At every moment, the difference in value between that of the conductance 7 and that of the conductance 8 is less than the conductance of the p+1th transistor which is switched alternately on and off by the signal 17. The signal 17 forms the digital control signal for approximating the exact value given by the conductance 8.

Simultaneously with its transmission to the conductance 7, the signal 17 is transmitted to a logic unit 4 which generates a digital signal 21. The signal 21 consists of n+1 binary signals, or bits, stored in a register 5. The numerical value of the signal 21 is directly equal to the number of bits which are at 1. At each pulse of the signal 16, the signal 21 is stored in the register 5 in the form of a word of n+1 bits which correspond one for one with the n+1 bits of the signal 21. This word is transmitted in the form of a signal 23 of n+1 bits in parallel to one or more variable integrated conductances 6.

Figure 3:
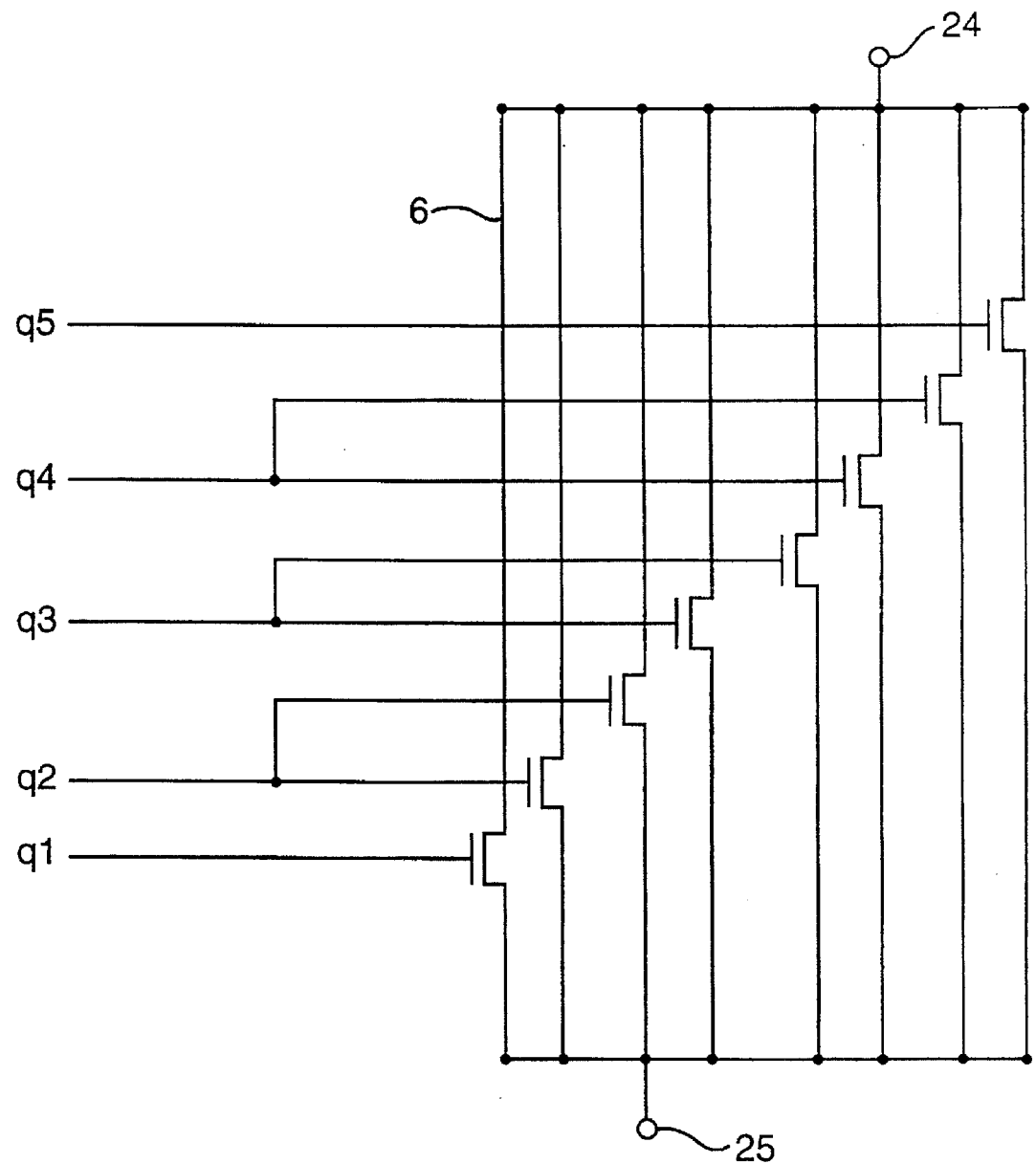
FIG. 3 shows an adjustable integrated conductance in accordance with the invention.

FIG. 3 shows an example of an embodiment of the variable integrated conductance 6. The conductance 6 comprises a network of 2n transistors, identical to the network of 2n transistors of the conductance 7. The drains of all the transistors are connected to a node 24 and the sources of all the transistors are connected to a node 25. Accordingly, it is possible to use the conductance 6 in the component 14 by connecting the nodes 24 and 25 to other elements of this component. The first and last bits of the signal 23 drive the first and last transistors of the network, respectively. Each of the other bits of the signal 23 drives simultaneously the gates of two transistors of the network forming the conductance 6. The transistor driven by the first bit of the signal 23 corresponds to the first transistor of the network of the conductance 7. For the values of q from 2 to n, each pair of transistors driven by the qth bit of the signal 23 corresponds to the transistors of the network of the conductance 7 which are driven by the (2q−2)th and the (2q−1)th bit of the signal 17. Accordingly, the first q bits of the signal 23 which are at 1 switch on the first (2q−1) transistors of the network forming the conductance 6, whereas the other (n+1−q) bits of the signal 23, which are at 0, switch the other (2n−2q+1) transistors off. In this way, the (2q−1) transistors which are on define the value of the conductance 6. The transistor driven by the (n+1)th bit of the signal 23 corresponds to the 2nth transistor of the network of the conductance 7. Switching a bit of the signal 23 from 0 to 1 therefore increases the value of the conductance 6 by a value defined by the width W and the length l of the one or two transistors which are switched on by this bit. Accordingly, each elementary conductance defines a step corresponding to two successive levels of value of the digital control signal.

The signal 21 is generated in the following way by the logic unit 4. When the pth bit of the signal 17 switches to 1, where p=2q−1, the qth bit of the signal 21 switches to 1, and only switches back to 0 when the pth of the signal 17 switches to 0, where p=2q−2. The (2q−2)th bit of the signal 17 switching to 1, or the (2q−1)th bit switching to 0, leaves the qth bit of the signal 21 unchanged. However, if the (2q−2)th bit of the signal 17 stays at 1, where q=n+1, this means that the signal 17 has reached saturation at the value n. The (n+1)th bit of the signal 17 is then switched to 1. Hence, the incrementation, or the double decrementation, of the value of the digital control signal included between two successive values of the integrated conductance switches in, or respectively switches out, one elementary conductance of the integrated conductance 6.

Accordingly, when the signal 17 oscillates between the values (2q−1) and (2q−2), or between the values (2q−1) and 2q, the signal 23, which is the image of the signal 21, stays stably at the value (2q−1). When the first q bits of the signal 23 switch on the first (2q−1) transistors of the conductance 6, the signal 17 switches on the first p transistors of the conductance 7, where p=2q−1 or p=2q or p=2q−2. As the conductance 6 and the conductance 7 are integrated into the same component 14, the identical structures of their transistors give the same values of conductance, independently of operational drift and of manufacturing dispersion, whose characteristics affect all the elements of the same component in common. Accordingly, the value of the conductance 6 is equal to the value of the conductance 7 within the approximation of the conductance value equal at maximum to the conductances of the 2qth and the (2q−1)th last transistors of each of these conductances which are on.

When the value of the signal 17 oscillates between 2q−1 and 2q in the stabilised condition, as we have seen previously, this corresponds to two values of the conductance 7, corresponding to 2q−1 and 2q transistors of this conductance switched on, and the value of the conductance standard 8 is included between these two values of the conductance 7. In the same way, when the value of the signal 17 oscillates between 2q−1 and 2q−2 in the stabilised condition, as we have seen previously, this corresponds to two values of the conductance 7, corresponding to 2q−1 and 2q−2 transistors of this conductance switched on, and that the value of the conductance standard 8 is included between these two values of the conductance 7. When the conductance 7 oscillates between two discrete values which straddle the value of the conductance 8 with a relative accuracy of $\Delta p$, the conductance 6 therefore remains stably at one of these two values, corresponding to 2q−1 transistors switched on, at the value of the conductance 8 within the same relative accuracy. The error is no greater than for the conductance 7 but the conductance 6 has the advantage of not oscillating between two values straddling that of the conductance 8.

Accordingly, the discrete signal 17 approximates the desired real value of conductance by oscillating between two successive values which straddle this real value. The unit 4 enables the value of the conductance 6 to be adjusted to a stable value without changing the error interval of approximation to the desired real value in the signal 17.

Figure 4:
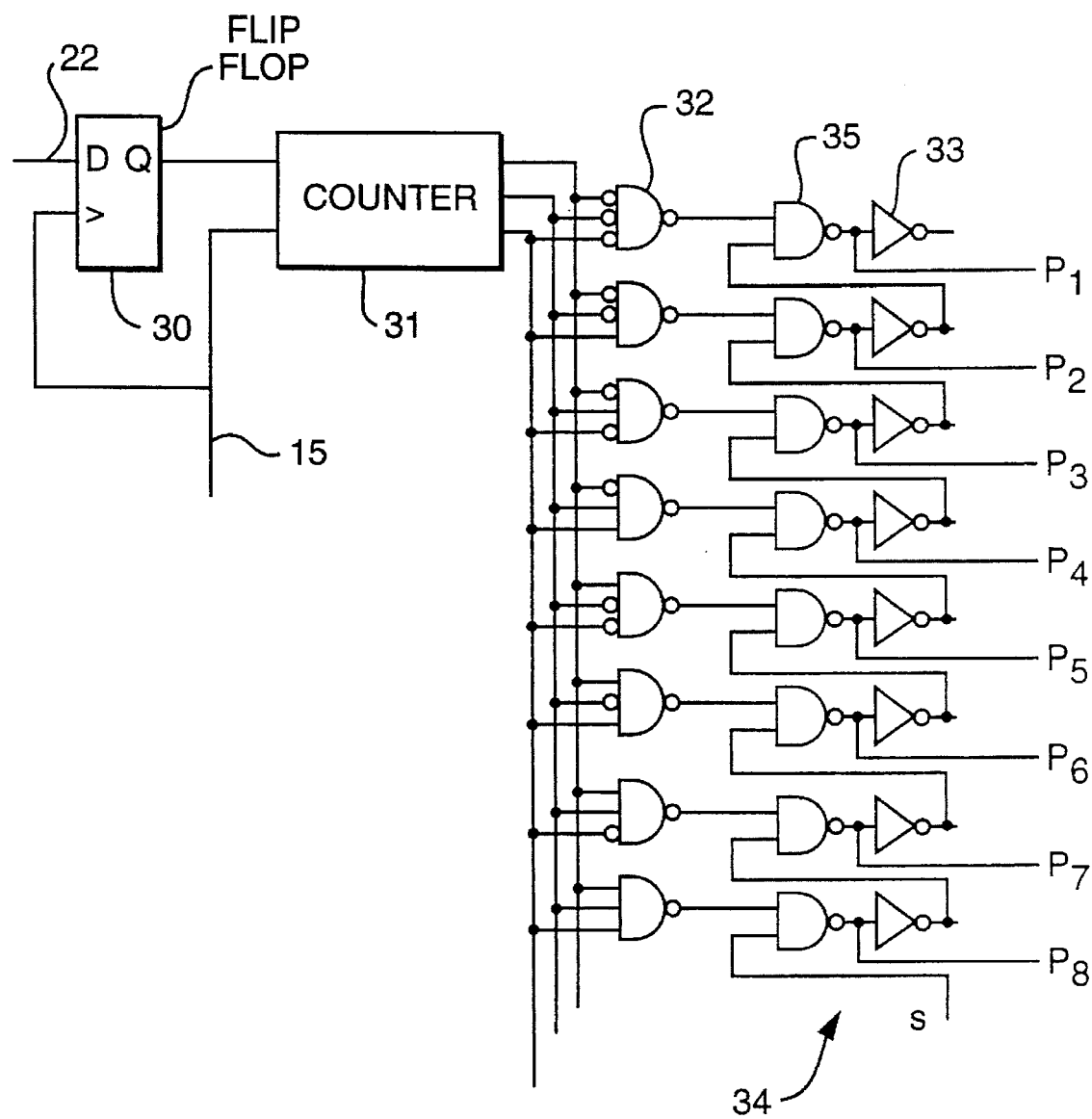
FIG. 4 shows a logic circuit for generating a reference signal.

FIG. 4 shows an example of an embodiment of the logic unit 2. The logic unit 2 comprises a D type flip flop 30, a BCD (binary coded decimal) type counter 31 and a combining circuit 34 comprising inverters 33 and NAND gates 32 and 35. The output Q of the flip flop 30 changes state at each pulse of the signal 15, according to the sign of the signal 22. The counter 31 changes state at each pulse of the signal 15, with a positive increment if the output Q is at 1 and a negative increment if the output Q is at 0. The flip flop 30 changes state on the rising edge of the signal 15, for example, and the counter 31 changes state on the falling edge of the signal 15. If the width of the pulse 15 is sufficient, it is therefore certain that the flip flop 30 will be in a stable state at 0 or 1 at the moment when the counter 31 counts, even in the metastable case when the signal 22 is just in the intermediate state in between the level 0 and the level 1. Accordingly, two successive values of the counter 31 are necessarily different by one unit. The number of output bits from the counter 31 is equal to the exponent of the power of two of the number of bits of the output signal 20 from the unit 2. The counter 31 is limited by a stop where all its bits are at zero, which prevents it counting down below the value 0 and by a stop where all its bits are 1 which prevents it counting up above the maximum value 2n. In the example where the number of bits of the signal 20 is 2n=8, the counter 31 is a three bit counter. The signal 20 consists of 2n bits, p1 to p8. The ith bit of the signal 20 is set to 1 by the ith gate 32 when the value of the counter is equal to i, and is maintained at 1 by the ith gate 35 as long as the (i+1) bit is at 1. The 2nth bit is not maintained by any following bit; to obtain this, it is possible, for example, to supply the second input of the 2nth gate 35 with a signal s which is constantly at 1.

Figure 5:
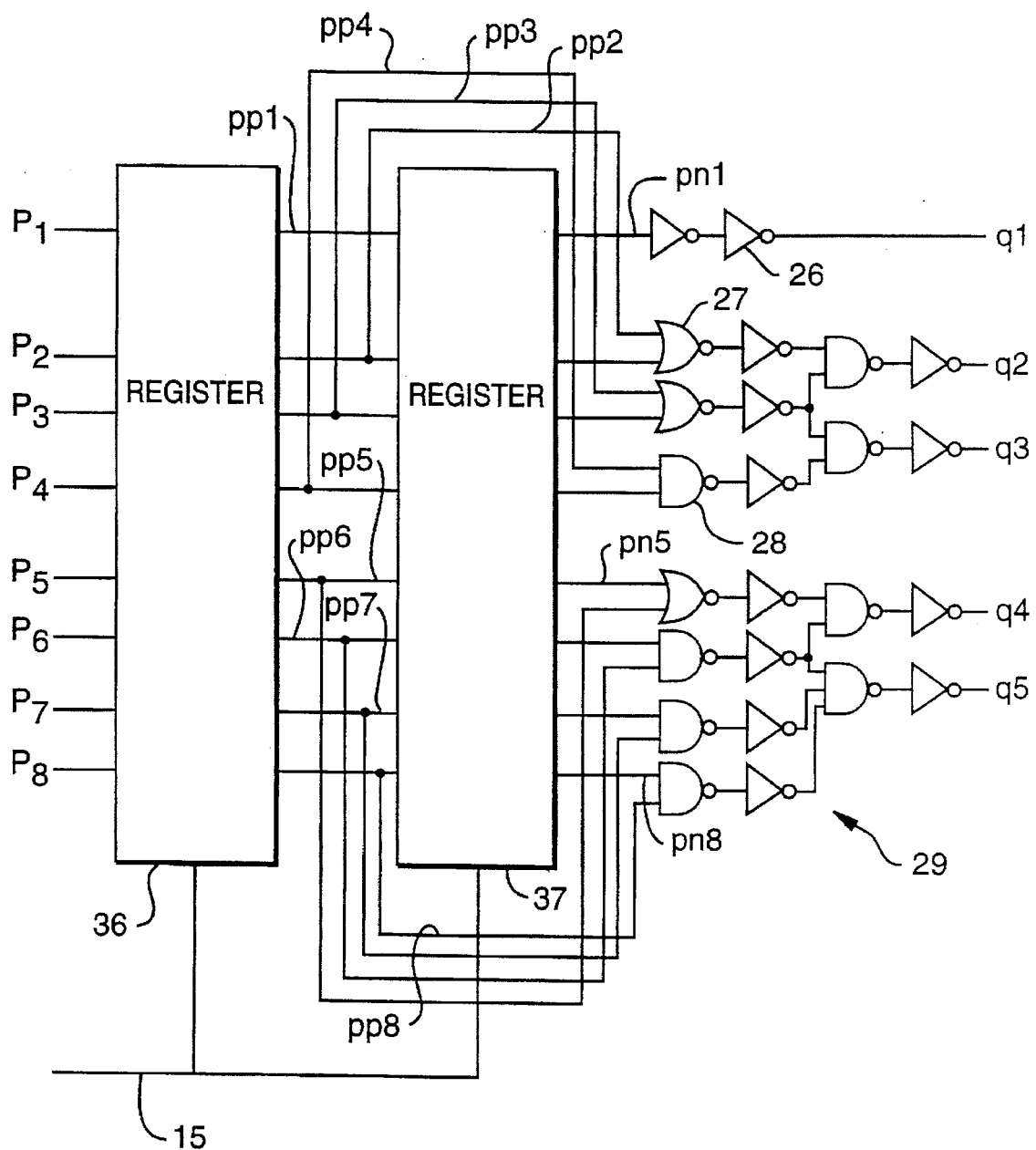
FIG. 5 shows a logic circuit for generating the drive signal.

FIG. 5 shows an example of an embodiment of the logic unit 4. The logic unit 4 comprises a flip flop register 36, updated by the clock signal 15. The signal 17 is inputted to the register 36 through 2n leads p1 to p8. The output from the register 36 is through 2n leads pp1 to pp8 which each transmit one bit equal to that of each of the 2n leads p1 to p8 at the rising edge of the signal 15. Each of the leads pp1 to pp8 is connected simultaneously to a flip flop register 37 and to a combining circuit 29 consisting of inverters 26, NOR gates 27 and NAND gates 28. The flip flop register 37 is updated by the clock signal 15. The output from the register 37 is through 2n leads pn1 to pn8 which each transmit one bit equal to that of each of the 2n leads pp1 to pp8 at the rising edge of the signal 15. Since the bits on the leads pp1 to pp8 are updated at the same rising edge of the signal 15, the bits on the leads pn1 to pn8 are equal to the bits on the leads pp1 to pp8 from the preceding clock cycle. The 2n output leads from the register 37 are connected to the combining circuit 29. The combining circuit 29 generates n+1 binary signals which, in the example of FIG. 2, have the references q1 to q5. The signals q1 to q5 obey the following logic equations, where the symbol + represents the disjunction logic operation and the symbol • represents the conjunction logic operation.

$q1 = pn1.$

This ensures a residual value for the conductance 6, which is identical to that of the conductance 7.

$q2 = (pp2 + pn2) \cdot (pp3 + pn3).$

The bits of the signal being set in succession to 1 in increasing order or being set to 0 in decreasing order, q2 is set to 1 as soon as pp3 is set to 1, and q2 is reset to 0 as soon as pp2 switches to 0, since then pp3 and pn3 are at 0.

$$q3=(pp3+pn3) \cdot (pp4 \cdot pn4).$$

The bit q3 is set to 1 if the bit p4 is at 1 twice running, that is to say the signal 17 changing permanently, if the bit p5 is set to 1. The bit q3 is reset to 0 as soon as pp4, that is to say p4, switches to 0.

$$q4=(pp5+pn5) \cdot (pp6 \cdot pn6).$$

$$q5=(pp6 \cdot pn6) \cdot (pp7 \cdot pn7) \cdot (pp8 \cdot pn8).$$

The bit q4 is set to 1 if the bit changing twice running, that is to say, the signal 17 changing permanently, if the bit p7 is set to 1. The bit q4 is reset to 0 as soon as pp6, that is to say p6, switches to 0. The bit q5 is set to 1 if the bit p8 is at 1 twice running, that is to say, the signal 17 changing permanently, if a bit p9, whether virtual or real, is set to 1. The bit q5 is reset to 0 as soon as pp8, that is to say p8, switches to 0.

Accordingly it will be noted that the bits q1 to q5 obey the conditions set previously for a signal 21 with n+1 bits where n=4. For powers of 2 greater than 4, it is sufficient to apply each of the last two equations giving q4 and q5 to each of the following pairs of bits. For example, for n=8:

$$q6=(pp9+pn9) \cdot (pp10 \cdot pn10).$$

$$q7=(pp10 \cdot pn10) \cdot (pp11 \cdot pn11) \cdot (pp12 \cdot pn12).$$

$$q8=(pp13+pn13) \cdot (pp14 \cdot pn14).$$

$$q9=(pp14 \cdot pn14) \cdot (pp15 \cdot pn15) \cdot (pp16 \cdot pn16).$$

Other combining circuits 29, which may readily be deduced from the function to be performed, are included within the scope of the present invention.

We claim:

1. An integrated circuit comprising at least one first conductance (6) adjustable by means of a digital control signal (17) encoding steps in value for the quantization of an exact value with a fixed relative accuracy, the first conductance (6) further comprising first elementary conductances each of which define a step in value, each first elementary conductance being dimensioned so that a single level of the value of the first conductance (6) corresponds to two successive levels of the value of the digital control signal (17), means for enabling a corresponding first elementary conductance when the first of the two levels of value of the digital control signal (17) results in a value which is lower than the exact value and for disabling a corresponding first elementary conductance when the first of the two levels of value of the digital control signal results in a value which is higher than the exact value.

2. An integrated circuit according to claim 1, further comprising a logic unit (4) which samples the digital control signal (17) having a frequency determined by a first signal (15), and generates a digital drive signal (21) of which q bits at a high level 1 enable q first elementary conductances of the first conductance (6), the qth bit of the signal (21) being set to 1, or respectively to a low level 0, by two successive samplings at 1, or respectively at 0, of the (2q−2)th bit of the signal (17).

3. An integrated circuit according to claim 1, comprising a logic unit (4), generating a digital drive signal (21) of which q bits at a high level 1 enable q first elementary conductances of the first conductance (6), the qth bit of the signal (21) being set to 1, or respectively to a low level 0, by the switching to 1 of the (2q−1)th bit, or respectively by the switching to 0, of the (2q−2)th bit, of the signal (17).

4. An integrated circuit according to claim 1, comprising a second conductance (7), said second conductance comprising second elementary conductances each of which define a step in value, each second elementary conductance being dimensioned so that one level of the value of the second conductance (7) corresponds to one level of the value of the digital control signal (17), means for enabling, or respectively disabling, one second elementary conductance of the second conductance (7) when the level of the digital control signal (17) is at a high level 1, or respectively the level of the signal (17) is at a low level 0.

5. An integrated circuit according to claim 4, further comprising a comparator (1) adapted to generate a binary signal (22) having a first state, or respectively a second state, corresponding to a value of the second conductance (7) which is lower, or respectively higher, than the exact value of a third conductance (8), external to the integrated circuit.

6. An integrated circuit according to claim 5, comprising a logic unit (2) for sampling the binary signal (22) with a frequency determined by a first signal (15), and generating a second digital signal (20), a pth bit of the second digital signal (20) being set to a high level 1, or respectively set to a low level 0, by a sampling of the first state, or respectively of the second state, of the binary signal (22).

7. An integrated circuit according to claim 6, wherein the logic unit (2) comprises a counter (31) and a combining circuit (34), the counter (31) being incremented, or respectively decremented, by a first state, or respectively by a second state, of the binary signal (22), the combining circuit (34) setting to a high level 1 a number p of the bits of the second digital signal (20) equal to the value given by the counter (31).

* * * * *

UNITED STATES PATENT AND TRADEMARK OFFICE
CERTIFICATE OF CORRECTION

PATENT NO. : 5,652,538
DATED : Jul. 29, 1997
INVENTOR(S) : Boudry et al.

It is certified that error appears in the above-indentified patent and that said Letters Patent is hereby corrected as shown below:

Title page, item [54] and col. 1, line 1,

First line- - Delete "CURCUIT" and insert:

-- CIRCUIT --

Signed and Sealed this

Thirteenth Day of January, 1998

Attest:

BRUCE LEHMAN

Attesting Officer

Commissioner of Patents and Trademarks